US012767775B2

(12) United States Patent
Luo et al.

(10) Patent No.: US 12,767,775 B2
(45) Date of Patent: Oct. 20, 2026

(54) THERMOSETTING RESIN COMPOSITION AND APPLICATION THEREOF

(71) Applicant: SHENGYI TECHNOLOGY CO., LTD., Dongguan (CN)

(72) Inventors: Cheng Luo, Dongguan (CN); Yundong Meng, Dongguan (CN); Shanyin Yan, Dongguan (CN)

(73) Assignee: SHENGYI TECHNOLOGY CO., LTD., Dongguan (CN)

(*) Notice: Subject to any disclaimer, the term of this patent is extended or adjusted under 35 U.S.C. 154(b) by 721 days.

(21) Appl. No.: 18/270,290

(22) PCT Filed: Mar. 19, 2021

(86) PCT No.: PCT/CN2021/081800

§ 371 (c)(1),
(2) Date: Jun. 29, 2023

(87) PCT Pub. No.: WO2022/141815

PCT Pub. Date: Jul. 7, 2022

(65) Prior Publication Data

US 2024/0110027 A1 Apr. 4, 2024

(30) Foreign Application Priority Data

Dec. 29, 2020 (CN) ........................ 202011599724.4

(51) Int. Cl.

| | |
|---|---|
| ***C08L 33/04*** | (2006.01) |
| ***C08J 5/24*** | (2006.01) |
| ***C08K 5/00*** | (2006.01) |
| ***C08L 47/00*** | (2006.01) |
| ***C08L 53/02*** | (2006.01) |
| ***C08L 71/12*** | (2006.01) |
| ***H05K 1/03*** | (2006.01) |

(52) U.S. Cl.

CPC ............... *C08J 5/244* (2021.05); *C08J 5/249* (2021.05); *C08K 5/0066* (2013.01); *C08L 33/04* (2013.01); *C08L 47/00* (2013.01); *C08L 53/02* (2013.01); *C08L 71/126* (2013.01); *H05K 1/0366* (2013.01); *C08J 2309/06* (2013.01); *C08J 2315/00* (2013.01); *C08J 2333/04* (2013.01); *C08J 2353/02* (2013.01); *C08J 2371/12* (2013.01); *C08K 2201/005* (2013.01); *C08K 2201/011* (2013.01); *C08L 2203/30* (2013.01); *C08L 2205/035* (2013.01); *C08L 2312/02* (2013.01)

(58) Field of Classification Search

CPC combination set(s) only.
See application file for complete search history.

(56) References Cited

U.S. PATENT DOCUMENTS

| | | | |
|---|---|---|---|
| 5,106,696 | A | 4/1992 | Chundury et al. |
| 2020/0347219 | A1 | 11/2020 | Ding et al. |

FOREIGN PATENT DOCUMENTS

| | | | | |
|---|---|---|---|---|
| CN | 107513142 A | | 12/2017 | |
| CN | 109504062 A | | 3/2019 | |
| CN | 109836631 A | | 6/2019 | |
| CN | 111253702 A | | 6/2020 | |
| CN | 111372372 A | | 7/2020 | |
| CN | 112020203 A | * | 12/2020 | ............. G03F 7/027 |
| EP | 3745205 A1 | * | 12/2020 | ............... B41C 1/00 |
| IN | 111253888 A | | 6/2020 | |
| JP | 2019006879 A | | 1/2019 | |
| WO | 0192408 A1 | | 12/2001 | |

OTHER PUBLICATIONS

International Search Report issued in PCT/CN2021/081800 on Sep. 16, 2021.

Office Action issued on Dec. 22, 2022 by the CIPO in the corresponding Patent Application No. 202011599724.4 with English translation.

Office Action issued on Dec. 3, 2021 by the TW PO in the corresponding Patent Application No. 110111418, with English translation.

* cited by examiner

*Primary Examiner* — Peter A Salamon
(74) *Attorney, Agent, or Firm* — NORTON ROSE FULBRIGHT US LLP

(57) ABSTRACT

The present invention relates to a thermosetting resin composition and application thereof, said thermosetting resin composition comprising: A: a styrene-butadiene-styrene triblock copolymer having a star-shaped structure; B: a linear olefin resin containing 1,2-ethylene, and a modifier thereof, C: at least one resin or small molecule compound substituted with an acrylic group; taking the total mass of component A, component B, and component C as 100%, the added amount of said component A is 3%-85%, the added amount of said component B is 10%-95%, and the added amount of said component C is 1%-70%. The resin composition provided by the present invention does not undergo phase separation under initiator conditions, and has high heat resistance and a relatively low dielectric constant and dielectric loss tangent value, and is capable of providing the desired dielectric properties and thermal reliability of a copper-clad plate.

18 Claims, No Drawings

THERMOSETTING RESIN COMPOSITION AND APPLICATION THEREOF

CROSS REFERENCE TO RELATED APPLICATIONS

This patent application is a national phase under 35 U.S.C. § 371 of International Patent Application No. PCT/CN2021/081800 filed Mar. 19, 2021, which claims the benefit of priority from Chinese Patent Application No. 202011599724.4 filed Dec. 29, 2020, each of which is hereby incorporated herein by reference in its entirety for all purposes.

TECHNICAL FIELD

The present application relates to the technical field of circuit materials, and especially, relates to a thermosetting resin composition and use thereof.

BACKGROUND

With the high-speed and multi-functional information processing of electronic products, and the increasing amount of transmitted information, the application frequency is required to be increased, and the communication equipment is required to be miniaturized. Hence, there is an urgent need for electronic equipment which is more miniaturized and lightweight and can transmit information at high speed. Currently, the traditional communication equipment operating frequency is generally more than 500 MHz, mostly 1-10 GHz; with the need to transmit large-amount information in a short period of time, the operating frequency is increasingly improved; the increasing frequency brings signal integrity problems; the dielectric property of the copper clad laminate material, as the basic material for signal transmission, is a major aspect that affects signal integrity. Generally, the signal integrity is better in a case where the dielectric constant of the substrate material is smaller, the transmission rate is faster and the dielectric loss tangent value is smaller. Therefore, how to reduce the dielectric constant and dielectric loss tangent value of the substrate is a hot technical issue in recent years.

Additionally, in order to satisfy the requirements of the printed circuit board (PCB) processing performance and the terminal electronic product performance, the copper clad substrate material must have good dielectric properties, heat resistance and mechanical properties.

As is well-known, there are a variety of materials with low dielectric constant and low dielectric loss tangent value, such as polyolefin, a fluorine resin, polystyrene, polyphenylene ether, modified polyphenylene ether, and a butadiene-styrene copolymer resin. The above resins have small polarity, the interaction between the resins is weak, and due to the slow initiation and fast growth of olefin resin under the initiator conditions, the molecules around the active center position grows faster, and the molecular mass increases rapidly, and therefore, although the above resins have good dielectric properties, they have poor compatibility and can be rapidly precipitated from the resin system, resulting in phase separation. The components of each phase are different, which thus have inconsistent thermal properties, leading to poor heat resistance and reliability. Hence, the linear styrene-butadiene block polymer (SBS) is commonly used as compatibilizer in the art to improve or solve the phase separation problem of the resin and allow the system to form a homogeneous phase. However, the addition of too much SBS can lead to a significant decrease in the glass transition temperature (Tg) and a large coefficient of thermal expansion (CTE) of the sheet.

CN109504062A discloses a thermosetting resin composition, which uses a thermosetting polyphenylene ether resin, which has with a styrene group and an acrylic reaction functional group at the end and a ratio of the two different functional groups being 0.5-1.5, and a thermosetting polybutadiene resin, at least one thermoplastic resin, which is used to adjust heat resistance, fluidity and resin filling performance, and a plurality of peroxides with different half-life temperatures, which are combined to form a composite crosslinking initiator and can effectively increase the crosslinking density during the thermal hardening process; a crosslinking agent is also combined into the composition; the composition after hardening has low dielectric constant, low dielectric loss, high Tg, high rigidity and good prepreg cutability. However, the resin composition has a problem of poor compatibility under the initiator conditions, resulting in phase separation.

CN111253702A discloses a resin composition, and a prepreg and a circuit material using the same, the resin composition comprising an a unsaturated polyphenylene ether resin, a polyolefin resin, a terpene resin and an initiator; based on a total weight of the unsaturated polyphenylene ether resin, the polyolefin resin and the terpene resin being 100 parts by weight, the terpene resin has a content of 3-40 parts by weight; the polyolefin resin is selected from one or a combination of at least two of an unsaturated polybutadiene resin, an SBS resin and a butadiene-styrene resin. The resin composition obtained has good film-forming, bonding and dielectric properties, and the circuit board using the same has high interlayer peel strength and low dielectric loss. Similarly, the too much addition of SBS can lead to decreased Tg and CTE, which the insufficient addition will lead to poor compatibility of the components in the resin.

Therefore, there is an urgent need in the field to develop a new thermosetting resin composition, which can relieve the phase separation problem of the thermosetting resin composition system while guaranteeing the heat resistance.

SUMMARY

A first object of the present application is to provide a thermosetting resin composition. The resin composition does not undergo phase separation under initiator conditions, and at the same time has high heat resistance, low dielectric constant (Dk) and low dielectric loss tangent value (Df), and are capable of providing the required dielectric properties and thermal reliability of copper clad laminates.

To achieve the object, the present application adopts the following technical solutions.

The present application provides a thermosetting resin composition, and the thermosetting resin composition includes:

A: a star-structured styrene-butadiene-styrene triblock copolymer;

B: a linear 1,2-position vinyl-containing olefin resin and a modified substance thereof;

C: a resin or a small-molecule compound substituted with at least one (preferably 1-6, such as 2, 3, 4, 5, etc.) acrylic group;

based on a total mass of component A, component B and component C being 100%, an addition amount of the component A is 3%-85%, an addition amount of the component B is 10%-95% and an addition amount of the component C is 1%-70%.

An addition amount of the component A is 3%-85%, such as 4%, 5%, 6%, 7%, 8%, 9%, 10%, 15%, 20%, 30%, 40%, 50%, 60%, 70%, 80%, etc.; an addition amount of the component B is 10%-95%, such as 15%, 20%, 25%, 30%, 35%, 40%, 45%, 50%, 55%, 60%, 65%, 70%, 75%, 80%, 85%, 90%, 93%, etc.; an addition amount of the component C is 1%-70%, such as 5%, 10%, 15%, 20%, 25%, 30%, 35%, 40%, 45%, 50%, 55%, 60%, 65%, etc.

In the present application, the 1,2-position vinyl-containing olefin resin includes not only the resin that has olefin as the main chain, but also the olefin-modified resin.

In the present application, the star-structured styrene-butadiene-styrene triblock copolymer (SBS) added in the thermosetting resin composition, because of its multi-arm structure, has more chances to contact with the linear 1,2-position vinyl-containing olefin resin and the modified substance thereof in the resin system. Under the action of the initiator, the reactive vinyl of the star structure can link to the small-molecule components quickly and thus form a homogeneous and dense crosslinking network, preventing the resin from phase separation and aggregation and having a high crosslinking density. The problem of phase separation can be effectively relieved at a low addition level, and even at a high addition level, there is no negative influence on the heat resistance, dielectric constant and dielectric loss tangent value of the system. The required dielectric properties and thermal reliability of the copper clad laminates are provided.

The present application adopts the linear 1,2-position vinyl-containing olefin resin and the modified substance thereof, which can ensure that the resin liquid has a low viscosity and can easily impregnate the filler, flame retardant and glass fiber.

In the present application, because the star-structured SBS added in the thermosetting resin composition has a multi-arm structure and lots of vinyl groups (1,2-position vinyl groups) that can participate in the reaction, it can well combined with the linear olefin resin and the modified resin thereof, forming a homogeneous phase. Hence, it is avoided that one small molecule resin reacts quickly and locally and forms a phase, while most other small molecules are difficult in participating in the crosslinking curing reaction due to the good fluidity. Thus the problem of phase separation is further relieved, and the dielectric properties and thermal reliability of the resin composition and the copper clad laminate are improved.

Preferably, the star-structured styrene-butadiene-styrene triblock copolymer has the following structure:

$Y \text{—}(X)_m$;

- the Y is C6-C10 aryl, C1-C6 chain alkyl or C3-C6 cycloalkyl;
- the X is a styrene-butadiene-styrene triblock copolymer chain;
- the m is an integer from 3 to 5, such as 4.

In the above structural formula, X can be linked at any substituent site of Y.

Preferably, the star-structured styrene-butadiene-styrene triblock copolymer has a number average molecular mass of 5000-60000, such as 8000, 10000, 15000, 20000, 25000, 30000, 35000, 40000, 45000, 50000, 550000, etc. The molecular mass is determined by gel permeation chromatography based on polystyrene calibration with reference to the test method of GB/T 21863-2008.

Preferably, the linear 1,2-position vinyl-containing olefin resin and the modified substance thereof include any one or a combination of at least two of polybutadiene, a butadiene-styrene copolymer, epoxidized polybutadiene, hydroxyl-modified polybutadiene, maleic anhydride-modified polybutadiene, a maleic anhydride-modified butadiene-styrene copolymer, or olefin-modified polyphenylene ether resin.

Preferably, the linear 1,2-position vinyl-containing olefin resin and the modified substance thereof have a number average molecular mass of 800-20000, such as 1000, 2000, 3000, 4000, 5000, 6000, 7000, 8000, 9000, 10000, 12000, 14000, 16000, 20000, etc.

The acrylic group can linked at any substituent site on the resin or the small-molecule compound, which may be, for example, on the end groups of the resin, or on the side chains of the resin.

Preferably, the acrylic group has the following structure:

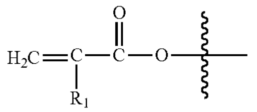
;

the $R_1$ is selected from a hydrogen atom or methyl;

in which the wavy line mark represents a linking bond.

Preferably, in the resin or the small-molecule compound substituted with at least one acrylic group, the resin includes any one of

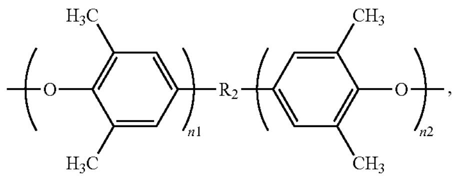
, polybutadiene, aliphatic polyurethane, or a butadiene-styrene copolymer;

- in which a sum of n1 and n2 is an integer from 10 to 20, such as 11, 12, 13, 14, 15, 16, 17, 18, 19, etc.;
- the $R_2$ has a structure selected from any one of the following:

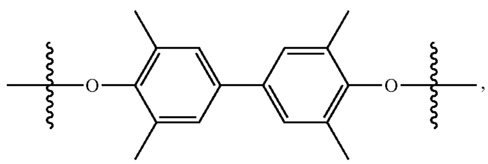
,

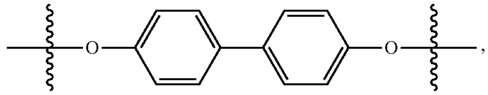
,

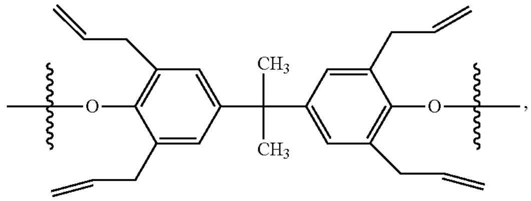
,

-continued

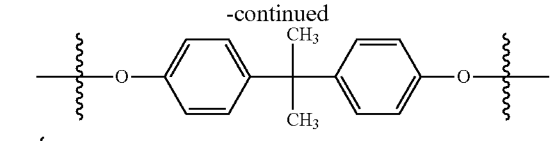
,

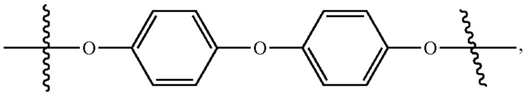
, or

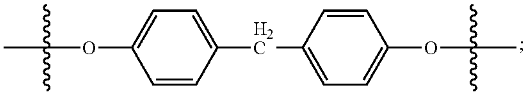
;

in which the wavy line mark represents a linking bond.

Preferably, in the resin or the small-molecule compound substituted with at least one acrylic group, the small-molecule compound includes any one of

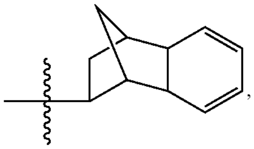 [SMILES: *C1CC2CC1C1C=CC=CC21]
,

C6-C18 linear alkane,

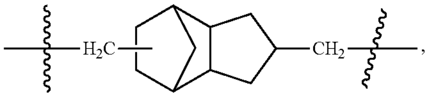
,

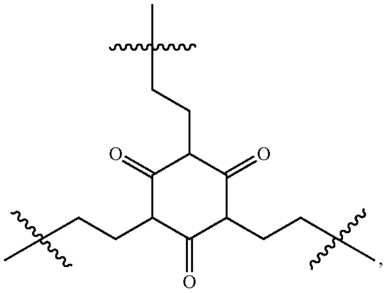
,

-continued

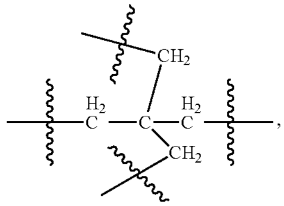
, or

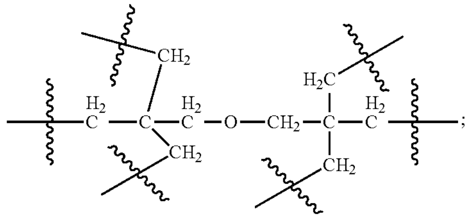
;

in which the wavy line mark represents a substitution site on the small-molecule compound for the acrylic group. The above wavy lines only represent the position for substitutions, and do not mean that all the above positions are linked with substitutions. Actually, there may be one substitution or at least two substitutions. The present application has no limitation on the specific number of the substitution.

Preferably, the thermosetting resin composition further includes component D: an auxiliary crosslinker substituted with vinyl or allyl, and a polymer thereof, which has the following structure:

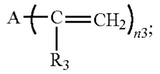
;

the n3 is 2 or 3;

the $R_3$ is selected from a hydrogen atom or methyl;

the A has a structure selected from any one of the following:

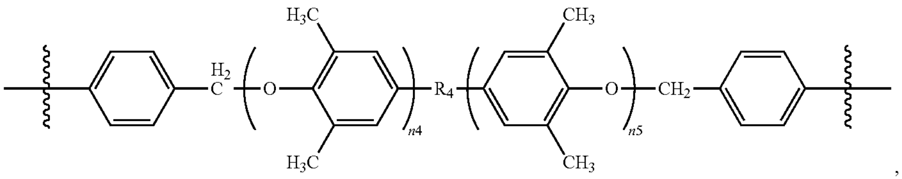
,

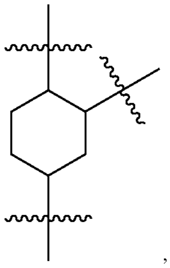
,

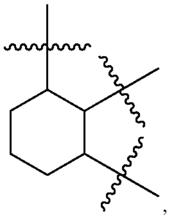
,

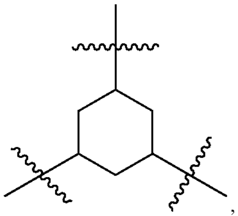
,

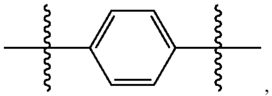
,

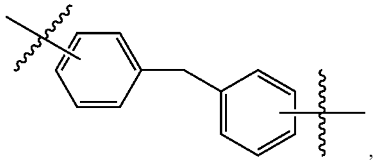
,

-continued

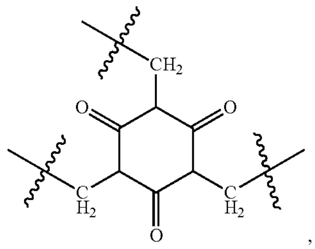
,

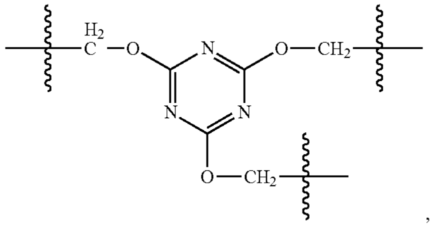
, or

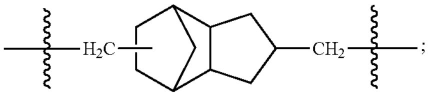
;

in which a sum of n4 and n5 is an integer from 10 to 20, such as 11, 12, 13, 14, 15, 16, 17, 18, 19, etc.;

the $R_4$ has a structure selected from any one of the following:

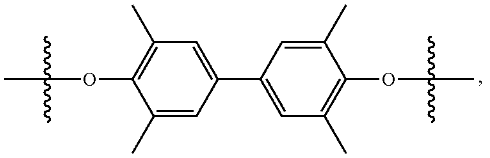
,

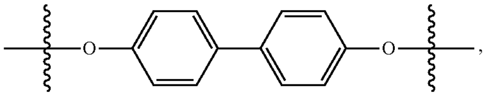
,

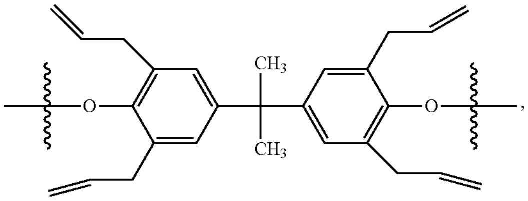
,

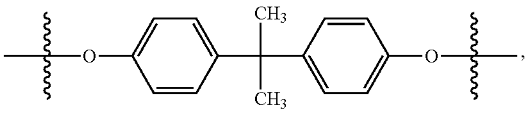
,

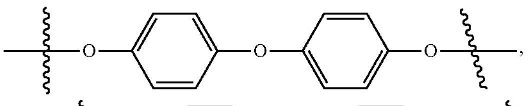
, or

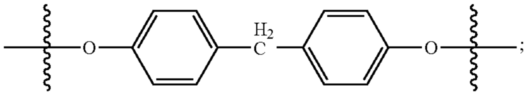
;

in which the wavy line mark represents a linking bond.

Preferably, based on a total mass of component A, component B, component C and component D being 100%, an addition amount of the component D is 1%-70%, such as 5%, 10%, 15%, 20%, 25%, 30%, 35%, 40%, 45%, 50%, 55%, 60%, 65%, etc.

Preferably, the thermosetting resin composition further includes component E: an auxiliary crosslinker substituted with at least one maleimide group.

Preferably, based on a total mass of component A, component B, component C, optional component D and component E being 100%, an addition amount of the component E is 1%-50%, such as 5%, 10%, 15%, 20%, 25%, 30%, 35%, 40%, 45%, etc. In other words, if component D is not included, an addition amount of the component E is 1%-50% based on a total mass of component A, component B, component C and component E being 100%; if component D is included, an addition amount of the component E is 1%-50% based on a total mass of component A, component B, component C, component D and component E being 100%.

Preferably, the thermosetting resin composition further includes component F: a filler.

Preferably, the filler includes an inorganic filler and/or an organic filler.

Preferably, the inorganic filler includes any one or a combination of at least two of nonmetal oxide, metal nitride, nonmetal nitride, inorganic hydrate, inorganic salt, metal hydrate or inorganic phosphorus, preferably crystalline silica, fused silica, spherical silica, hollow silica, glass powder, aluminum nitride, boron nitride, silicon carbide, aluminum hydroxide, titanium dioxide, strontium titanate, barium titanate, aluminium oxide, barium sulfate, talc, calcium silicate, calcium carbonate or mica.

Preferably, the organic filler includes any one or a combination of at least two of a polytetrafluoroethylene powder, polyphenylene sulfide, an organophosphorus salt compound or a polyethersulfone powder.

Preferably, the filler has a median particle size of 0.01-50 μm, such as 1 μm, 2 μm, 3 μm, 4 μm, m, 10 μm, 15 μm, 20 μm, 25 μm, 30 μm, 35 μm, 40 μm, 45 μm, 48 μm, etc., preferably 0.01-20 μm, and more preferably 0.1-10 μm; the particle size is determined by a Malvern 2000 laser particle size analyzer.

Preferably, based on a total mass of component A, component B, component C, optional component D, and optional component E being 100%, an addition amount of the component F is 1%-400%, such as 5%, 10%, 20%, 50%, 100%, 150%, 200%, 250%, 300%, 350%, etc., preferably 20%-300%, and more preferably 30%-300%. The optional component D and the optional component E may be added or not.

Preferably, the thermosetting resin composition further includes component G: a radical initiator.

Preferably, the radical initiator includes any one or a combination of at least two of organic peroxide, a carbon radical initiator or an azo radical initiator.

Preferably, based on a total mass of component A, component B, component C, optional component D, and optional component E being 100%, an addition amount of the component G is 0.01%-6%, such as 0.05%, 0.1%, 0.2%, 0.3%, 0.4%, 0.5%, 0.6%, 0.7%, 0.8%, 0.9%, 1%, 2%, 3%, 4%, 5%, etc., preferably 0.1%-2%, and more preferably 0.5%-4%. The optional component D and the optional component E may be added or not.

Preferably, the thermosetting resin composition further includes component H: a flame retardant.

Preferably, the flame retardant includes a non-halogenated flame retardant and/or a halogenated flame retardant.

Preferably, the non-halogenated flame retardant includes any one or a combination of at least two of a phosphorus flame retardant, a nitrogen flame retardant, a P—N flame retardant, metal oxide, metal hydroxide, a silicone flame retardant or a non-halogenated flame retardant synergist.

Preferably, the non-halogenated flame retardant synergist includes a P—Si synergistic flame retardant.

Preferably, the phosphorus flame retardant includes any one or a combination of at least two of tris(2,6-dimethylphenyl)phosphine, 10-(2,5-dihydroxyphenyl)-9,10-dihydro-9-oxa-10-phospha phenanthrene-10-oxide, 2,6-bis(2,6-dimethylphenyl)phosphinobenzene, 10-phenyl-9,10-dihydro-9-oxa-10-phosphaphenanthrene-10-oxide, a phenoxyphosphonitrile compound, phosphate, polyphosphate, polyphosphonate or a phosphonate-carbonate copolymer.

Preferably, the nitrogen flame retardant includes melamine cyanurate.

Preferably, the P—N flame retardant includes any one or a combination of at least two of melamine polyphosphate, melamine phosphonate, ammonium polyphosphate, tripolyphosphonitrile or a tripolyphosphonitrile derivative.

Preferably, the halogenated flame retardant includes any one or a combination of at least two of bromotriazine, brominated polystyrene, polybrominated styrene, brominated SBS, brominated butylbenzene resin, brominated polybutadiene, poly(dibromophenyl ether), decabromodiphenyl ethane, tetrabromophthalic anhydride or ethylenebis (tetrabromophthalimide).

Preferably, based on a total mass of component A, component B, component C, optional component D, and optional component E being 100%, an addition amount of the component H is 1%-50%, such as 5%, 10%, 15%, 20%, 25%, 30%, 35%, 40%, 45%, etc. The optional component D and the optional component E may be added or not.

Preferably, the thermosetting resin composition further includes component I: a coupling agent.

Preferably, the coupling agent includes any one or a combination of at least two of vinyl siloxane, methacrylic siloxane or aniline siloxane.

Preferably, based on a total mass of component F being 100%, an addition amount of the component I is 0.25%-4%, such as 0.26%, 0.28%, 0.3%, 0.32%, 0.34%, 0.36%, 0.38%, etc.

The term "including" as used in the present application means that it may include, in addition to the components described, other components, and the other components give the resin composition different properties. Besides, the term "including" as used in the present application can also be replaced by "is" or "consisting of . . . ." which are the closed type.

For example, the thermosetting resin compositions in the present application can be added with a synergic thermosetting resin, such as a polyphenylene ether resin, a phenolic resin, a polyurethane resin, a melamine resin, etc., or can be added with a curing agent or a curing accelerator for these thermosetting resins.

In addition, the thermosetting resin compositions can also contain various additives, such as an antioxidant, a heat stabilizer, an antistatic agent, a UV absorber, a pigment, a colorant, a lubricant, etc. These thermosetting resins and the various additives can be used alone or in a mixture of two or more.

As a method of preparing the thermosetting resin composition of the present application, the resin can be obtained by mixing and stirring the components within the formulation according to a well-known method.

A second object of the present application is to provide a resin liquid, which is obtained by dissolving or dispersing the thermosetting resin composition according to the first object in a solvent.

Preferably, an emulsifier can be added during the dissolution or dispersion of the resin composition in the solvent as described above. The powder filler and the like can be dispersed uniformly in the liquid by adding with the emulsifier.

The solvent in the present application is not limited particularly, which includes, as specific examples, alcohols such as methanol, ethanol, butanol, etc., ethers such as ethyl cellosolve, butyl cellosolve, ethylene glycol-methyl ether, carbitol, butyl carbitol, etc., ketones such as acetone, butanone, methyl ethyl ketone, methyl isobutyl ketone, cyclohexanone, etc., aromatic hydrocarbons such as toluene, xylene, 1,3,5-trimethylbenzene, etc., esters such as ethoxy ethyl acetate, ethyl acetate, etc., and nitrogen-containing solvents such as N,N-dimethylformamide, N,N-dimethylacetamide, N-methyl-2-pyrrolidone, etc. The above solvents can be used alone or in a mixture of two or more, and preferably, the aromatic hydrocarbons such as toluene, xylene, or 1,3,5-trimethylbenzene is mixed with the ketones such as acetone, butanone, methyl ethyl ketone, methyl isobutyl ketone, or cyclohexanone for being used. The amount of the solvent can be chosen by those skilled in the art according to experiences, as long as the obtained resin liquid can have a suitable viscosity for use.

A third object of the present application is to provide a prepreg, and the prepreg includes a reinforcing material, and the thermosetting resin composition according to the first object which is adhered to the reinforcing material after impregnating and drying.

The reinforcing material in the present application is not limited particularly, which can be organic fiber, inorganic fiber woven fabric, or non-woven fabric. The organic fiber is preferably aramid non-woven fabric, and the inorganic fiber woven fabric can be E-fiberglass cloth, D-fiberglass cloth, S-fiberglass cloth, T-fiberglass cloth, NE-fiberglass cloth, and quartz cloth. A thickness of the reinforcing material is not limited particularly. For a laminate application and from the consideration of good dimensional stability, the woven cloth or non-woven fabric preferably has a thickness of 0.01-0.2 mm, and is preferably subjected to fiber splitting treatment as well as silane coupling agent surface treatment before being used. In order to provide good water and heat resistance, the silane coupling agent is preferably any one or a mixture of at least two of epoxy silane coupling agent, amino silane coupling agent or vinyl silane coupling agent. The prepreg is obtained by impregnating with the thermosetting resin composition, baking at 100-200° C. for 2-10 minutes and drying.

A forth object of the present application is to provide a laminate, and the laminate includes at least one prepreg according to the third object.

A fifth object of the present application is to provide a metal clad laminate, and the metal clad laminate includes at least one prepreg according to the third object and a metal foil claded on one or two sides of the stacked prepreg.

Preferably, the metal foil includes a copper foil.

A method of preparing the metal clad laminate provided by the present application is not particularly limited. Exemplarily, one or more prepregs are stacked together in a certain order, a metal foil is laminated on one or two sides of the stacked prepreg respectively, and then the metal clad laminate is obtained by being cured in a hot press; or one or more prepregs are stacked together in a certain order, a release film is laminated on one or two sides of the stacked prepreg respectively, and the insulation board or the single sided board is obtained by being cured in a hot press at a curing temperature of 150-250° C. and a curing pressure of 25-60 kg/$cm^2$.

The prepreg and the metal clad laminate in the present application have high heat resistance, low dielectric constant, and low dielectric loss tangent value.

A sixth object of the present application is to provide a printed circuit board, and the printed circuit board includes at least one laminate according to the forth object or one metal clad laminate according to the fifth object.

Preferably, the printed circuit board is a high frequency circuit substrate.

Compared with the prior art, the present application has the following beneficial effects.

In the present application, the star-structured styrene-butadiene-styrene triblock copolymer added in the thermosetting resin composition, because of its multi-arm structure, has more chances to contact with the linear 1,2-position vinyl-containing olefin resin and the modified substance thereof in the resin system. Under the action of the initiator, the reactive vinyl of the star structure can combine with the small-molecule components quickly and thus form a homogeneous and dense crosslinking network, preventing the resin from phase separation and aggregation and having a high crosslinking density. The problem of phase separation can be effectively relieved at a low addition level, and even at a high addition level, there is no negative influence on the heat resistance, dielectric constant and dielectric loss tangent value of the system. The required dielectric properties and thermal reliability of the copper clad laminates are provided.

DETAILED DESCRIPTION

The technical solutions of the present application will be further described below through embodiments. It should be apparent to those skilled in the art that the embodiments are only used for a better understanding of the present application and should not be regard as a specific limitation of the present application.

Table 1 shows the materials and their grade information involved in the examples and comparative examples below.

TABLE 1

| Component | Manufacturer | Grade |
|---|---|---|
| A: a star-structured styrene-butadiene-styrene triblock copolymer | Lee Chang Yung, Taiwan | 3401 |
| | Lee Chang Yung, Taiwan | 3411 |
| | Lee Chang Yung, Taiwan | 3414 |
| | Kraton, Shanghai | DX0222 |
| A': a linear styrene-butadiene-styrene triblock copolymer (SBS) | Kraton, Shanghai | DX408 |
| B: a linear olefin resin and a modified substance thereof | Nippon Soda, Japan | B1000 |
| | Nippon Soda, Japan | B2000 |
| | Nippon Soda, Japan | B3000 |
| | Cray Valley, USA | R100 |
| | Cray Valley, USA | R181 |
| C: a resin or a small-molecule compound substituted with at least one acrylic group | Sabic, Saudi | SA9000 |
| | Sartomer, USA | CD535 |
| | Cray Valley, USA | R3500 |
| | Sartomer, USA | SR368NS |
| | Sartomer, USA | SR295NS |

TABLE 1-continued

| Component | Manufacturer | Grade |
|---|---|---|
| D: an auxiliary crosslinker substituted with vinyl or allyl, and a polymer thereof | Mitsubishi Gas, Japan | OPE-1200 |
| | Fangruida, Hunan | TAIC-A |
| | Fangruida, Hunan | TMAIC |
| | Evonik, Germany | TVCH |
| | Nippon Steel, Japan | ODV |
| | Wujin Linchuan Chemical, Jiangsu | BVPE |
| E: an auxiliary crosslinker substituted with at least one maleimide group | Honghu, Hubei | BDM |
| | Feixiang, Jiangsu | BMI-E |
| F: a filler | Novoray, Jiangsu | DQ1028L |
| G: a radical initiator | Nouryon, USA | BIPB |
| | Nouryon, USA | DYBP |
| H: a flame retardant | Albemarle, USA | XP7866 |
| | Albemarle, USA | 8010 |
| I: a coupling agent | Dow | OFS-6030 |
| | Shin-Etsu, Japan | KBM-573 |
| | Shin-Etsu, Japan | KBM-1003 |

Examples 1-17 and Comparative Examples 1-3

Thermosetting resin compositions were prepared according to the components shown in Tables 2 to 4 (raw materials were added by parts by weight), and samples of copper clad laminates were prepared according to the following preparation method.

(1) The prescribed amounts of each component were dissolved, mixed and added into a reaction kettle, and diluted with toluene to an appropriate viscosity, stirred and mixed well to obtain a resin liquid.

(2) The 106 fiberglass cloth was impregnated with the above resin solution, and then dried to remove the solvent to obtain prepregs. The obtained prepregs were laminated with each other and then with two 35 RTF copper foils on two sides, respectively, and then cured in a hot press to prepare a copper clad laminate, in which the curing was carried out at 200° C. and a 30 kg/$cm^2$ for 200 min.

Performance Test (1) Glass transition temperature ($T_g$): tested by the DMA test, with reference to the DMA test method specified in IPC-TM-650 2.4.24.

(2) Dielectric constant (Dk) and dielectric loss factor (Df): tested with reference to the SPDR method.

(3) Evaluation of moisture and heat resistance (PCT): the copper foil on the surface of the copper clad laminate was etched and made into three 100 mm×100 mm substrates. Evaluation of the substrate: the substrate was placed in a pressure cooker and treated at 120° C. and 105 KPa for 6 hours, and then impregnated in a tin furnace at 288° C., and the time was recorded when the substrate delaminated and burst; when the substrate had held on for more than 5 min in the tin furnace without blistering or delamination, the evaluation could be terminated. In the evaluation, O means that there is no bursting or delamination within 5 min, X means that there is bursting and delamination within 5 min, and more X means more terrible heat-mositure resistance; the test results of three substrates were recorded. Exemplarily, record 000 if all three substrates have no delamination and bursting, and record OOX if two of them have no delamination and bursting but one has delamination and bursting.

(4) T330: a sample was prepared and tested by the TMA instrument with reference to the T300 method specified in IPC-TM-650 2.4.24.1, and the temperature was heated to 330° C. to investigate the time of delamination and bursting; when the time was more than 60 min, the evaluation could be terminated.

(5) Heat resistance: the sheet was prepared into 300 mm×300 mm copper clad samples, placed in an oven with a stable temperature of 288° C. and baked for 3 h, and then cooled to 30° C. within 1 h; then, observe whether the copper foil surface of the sheets blistered, and mark “X” for blistering, and mark “O” for no blistering.

(6) Phase separation: the sheet resin was inspected by SEM for phase separation, and mark “000” if the resin phase separation size was less than 1 μm; mark “OOX” if the resin phase separation size was 1-3 μm; mark “OXX” if the resin phase separation size was less than 3-5 μm; mark “XXX” if the resin phase separation size was more than 5 μm.

(7) Coefficient of thermal expansion (CTE): tested by the TMA instrument with reference to the CTE test standard specified in IPC-TM-650 2.4.24.1.

Results of the above tests are shown in Table 2-4.

TABLE 2

| | | Example 1 | Example 2 | Example 3 | Example 4 | Example 5 | Example 6 | Example 7 |
|---|---|---|---|---|---|---|---|---|
| A | 3401 | 10 | | | | | 10 | |
| | 3414 | | 20 | | | | | 20 |
| | 3411 | | | 40 | 85 | | | |
| | DX0222 | | | | | 3 | | |
| | DX408 | | | | | | | |
| B | B1000 | 20 | | 40 | 10 | | 19 | 60 |
| | B2000 | | 60 | | | | | |
| | B3000 | | | | | 27 | | |
| | R100 | | | | | | | |
| | R181 | | | | | | | |
| C | SA9000 | 70 | | | | 70 | | |
| | CD535 | | 20 | | | | | 10 |
| | R3500 | | | 20 | | | 1 | |
| | SR368NS | | | | 5 | | | |
| | SR295NS | | | | | | | |
| D | OPE-1200 | | | | | | 70 | |
| | TAIC-A | | | | | | | 10 |
| | TMAIC | | | | | | | |
| | TVCH | | | | | | | |
| | ODV | | | | | | | |
| | BVPE | | | | | | | |
| E | BDM | | | | | | | |
| | BMI-E | | | | | | | |
| F | DQ1028L | 30 | 50 | 100 | 200 | 300 | 50 | 90 |
| G | BIPB | | 1.5 | 1.5 | 2.5 | 3 | 1.2 | |
| | DYBP | 1.6 | | | | | | 0.9 |
| H | XP7866 | | | 40 | | 40 | 30 | 50 |
| | 8010 | 50 | 30 | | 40 | | | |
| I | OFS-6030 | | 0.5 | 4 | 1 | | | |
| | KBM-573 | | | | | 3 | | |
| | KBM-1003 | | | | | | | 0.9 |
| Performance | Tg(DMA)/° C. | 218 | >250 | >250 | 220 | 237 | 210 | >250 |
| | Dk(10 G) | 3 | 3 | 3.2 | 3.3 | 3.5 | 3.2 | 3.2 |
| | Df(10 G) | 0.0023 | 0.0023 | 0.0023 | 0.0018 | 0.0022 | 0.0023 | 0.0019 |
| | T330(with copper)/min | >60 | >60 | >60 | >60 | >60 | >60 | >60 |
| | 288° C./3 h | ○ | ○ | ○ | ○ | ○ | ○ | ○ |
| | PCT/6 h | ○○○ | ○○○ | ○○○ | ○○○ | ○○○ | ○○○ | ○○○ |
| | Phase separation | ○○○ | ○○○ | ○○○ | ○○○ | ○○○ | ○○○ | ○○○ |
| | CTE | 2.50% | 2.00% | 1.70% | 1.70% | 1.30% | 2.50% | 1.70% |

TABLE 3

| | | Example 8 | Example 9 | Example 10 | Example 11 | Example 12 | Example 13 | Example 14 |
|---|---|---|---|---|---|---|---|---|
| A | 3401 | | | | | 20 | | |
| | 3414 | | | | | | | |
| | 3411 | 40 | | | | | | |
| | DX0222 | | 20 | 20 | 20 | | 30 | 20 |
| | DX408 | | | | | | | |
| B | B1000 | 40 | 50 | 50 | 30 | 65 | | |
| | B2000 | | | | | | | |
| | B3000 | | | | | | | |
| | R100 | | | | | | 20 | |
| | R181 | | | | | | | 20 |
| C | SA9000 | | 20 | | | | | 20 |
| | CD535 | | | | | | | |
| | R3500 | 5 | | | | 5 | | |

TABLE 3-continued

| | | Example 8 | Example 9 | Example 10 | Example 11 | Example 12 | Example 13 | Example 14 |
|---|---|---|---|---|---|---|---|---|
| | SR368NS | | | 1 | | | | |
| | SR295NS | | | | 10 | | 5 | |
| D | OPE-1200 | | | | | | | |
| | TAIC-A | | | | | | | |
| | TMAIC | 15 | | | | | | |
| | TVCH | | 10 | | | | | |
| | ODV | | | 29 | | | | 20 |
| | BVPE | | | | 40 | | | |
| E | BDM | | | | | 10 | | |
| | BMI-E | | | | | | 45 | 20 |
| F | DQ1028L | 70 | 80 | 100 | 60 | 400 | 100 | 50 |
| G | BIPB | 1.6 | 1.6 | 7 | | 1 | | 1 |
| | DYBP | | | | 0.2 | | 1 | 1 |
| H | XP7866 | 40 | | | | | 30 | |
| | 8010 | | 30 | 20 | 20 | | | 20 |
| I | OFS-6030 | | | | | | | |
| | KBM-573 | | | | | | | |
| | KBM-1003 | 0.7 | 0.8 | 1 | 0.6 | | | |
| Performance | Tg(DMA)/° C. | >250 | >250 | >250 | >250 | >250 | >250 | >250 |
| | Dk(10 G) | 3.1 | 3.3 | 3 | 30 | 3.4 | 3.3 | 3.1 |
| | Df(10 G) | 0.0022 | 0.0020 | 0.0021 | 0.0022 | 0.0018 | 0.0028 | 0.0023 |
| | T330(with copper)/min | >60 | >60 | >60 | >60 | >60 | >60 | >60 |
| | 288° C./3 h | ○ | ○ | ○ | ○ | ○ | ○ | ○ |
| | PCT/6 h | ○○○ | ○○○ | ○○○ | ○○○ | ○○○ | ○○○ | ○○○ |
| | Phase separation | ○○○ | ○○○ | ○○○ | ○○○ | ○○○ | ○○○ | ○○○ |
| | CTE | 2.00% | 1.20% | 1.10% | 1.20% | 0.80% | 0.80% | 1.20% |

TABLE 4

| | | Example 15 | Example 16 | Example 17 | Comparative Example 1 | Comparative Example 2 | Comparative Example 3 |
|---|---|---|---|---|---|---|---|
| A | 3401 | | 10 | | 10 | 1 | |
| | 3414 | | | | | | |
| | 3411 | | | | | | |
| | DX0222 | 25 | | 15 | | | |
| | DX408 | | | | | | 10 |
| B | B1000 | | 15 | | 5 | 29 | 20 |
| | B2000 | | | | | | |
| | B3000 | 25 | | 15 | | | |
| | R100 | | | | | | |
| | R181 | | | | | | |
| C | SA9000 | 25 | | 15 | 85 | 70 | 70 |
| | CD535 | | | | | | |
| | R3500 | | 1 | | | | |
| | SR368NS | | | | | | |
| | SR295NS | | | | | | |
| D | OPE-1200 | | 74 | | | | |
| | TAIC-A | | | | | | |
| | TMAIC | | | | | | |
| | TVCH | | | | | | |
| | ODV | | | | | | |
| | BVPE | 20 | | | | | |
| E | BDM | | | | | | |
| | BMI-E | 5 | | 55 | | | |
| F | DQ1028L | 50 | 50 | 50 | 30 | 30 | 30 |
| G | BIPB | | 1 | | | | |
| | DYBP | 1 | | 1 | 1.6 | 1.6 | 1.6 |
| H | XP7866 | | 30 | | | | |
| | 8010 | 30 | | 30 | 50 | 50 | 50 |
| I | OFS-6030 | | | | | | |
| | KBM-573 | | | | | | |
| | KBM-1003 | | | | | | |
| Performance | Tg(DMA)/°C. | >250 | 201 | >250 | 210 | 213 | 180 |
| | Dk(10 G) | 3.1 | 3 | 3.2 | 3.4 | 3.2 | 3 |
| | Df(10 G) | 0.0023 | 0.0024 | 0.0028 | 0.0027 | 0.0023 | 0.0023 |
| | T330(with copper)/min | >60 | >60 | >60 | >60 | 40 | 20 |

TABLE 4-continued

| | Example 15 | Example 16 | Example 17 | Comparative Example 1 | Comparative Example 2 | Comparative Example 3 |
|---|---|---|---|---|---|---|
| 288° C./3 h | ○ | X | X | X | X | X |
| PCT/6 h | ○○○ | ○XX | XXX | ○○○ | ○XX | ○○X |
| Phase separation | ○○○ | ○XX | XXX | ○○○ | XXX | XXX |
| CTE | 1.50% | 2.80% | 1.00% | 4.00% | 2.40% | 5.00% |

As can be seen from Tables 2-4, the resin composition provided by the present application has effectively relieved phase separation phenomenon, and the prepared copper clad laminate has high heat resistance, low dielectric constant, low dielectric loss tangent value, and high reliability. The glass transition temperature can reach more than or equal to 210° C., Dk is less than or equal to 3.5, Df is less than or equal to 0.0030, the time of delamination and bursting is more than 60 min in the T330 (with copper) test, no bursting or delamination appears in the pressure cooker test within 5 min, the phase separation size of the resin composition is less than 1 μm, and the coefficient of thermal expansion is less than or equal to 2.5%.

From the comparison between Example 1 and Comparative Example 3, it can be seen that the problem of phase separation is effectively relieved in the present application by adding the star-structured SBS (Example 1), compared with adding the linear SBS (Comparative Example 3), and the heat resistance and CTE are guaranteed.

As can be seen from the comparison between Example 1 and Comparative Examples 1-2, the above beneficial effects can be achieved only when the star-structured styrene-butadiene-styrene triblock copolymer, the linear 1,2-position vinyl-containing olefin resin and the modified substance thereof, and the resin or the small-molecule compound substituted with at least one acrylic group are added in the proportion prescribed by the present application. If the addition amount of the resin or the small-molecule compound substituted with at least one acrylic group is too high and the addition amount of the linear 1,2-position vinyl-containing olefin resin is too low (Comparative Example 1), the crosslinking density will be too low, resulting in insufficient heat resistance, poor dielectric properties and poor CTE; if the addition amount of the star-structured styrene-butadiene-styrene triblock copolymer is too low (Comparative Example 2), the resin will have phase separation, resulting in poor heat resistance and poor heat-mositure resistance.

Although the detailed method of the present application is illustrated through the embodiments in the present application, the present application is not limited to the detailed method, which means that the present application is not necessarily rely on the detailed method to be implemented. It should be apparent to those skilled in the art that any improvement to the present application, equivalent substitution of each raw material of the product of the present application and the addition of auxiliary ingredients, the choice of specific methods, etc., all fall within the protection scope and disclosure scope of the present application.

What is claimed is:

1. A thermosetting resin composition, comprising:

A: a star-structured styrene-butadiene-styrene triblock copolymer;

B: a linear 1,2-position vinyl-containing olefin resin and a modified substance thereof, C: a resin or a small-molecule compound substituted with at least one acrylic group;

based on a total mass of component A, component B and component C being 100%, an addition amount of the component A is 3%-85%, an addition amount of the component B is 10%-95%, and an addition amount of the component C is 1%-70%, wherein the star-structured styrene-butadiene-styrene triblock copolymer has the following structure:

$$Y{-}(X)_m$$

the Y is C6-C10 aryl, C1-C6 chain alkyl or C3-C6 cycloalkyl, the X is a styrene-butadiene-styrene triblock copolymer chain, the m is an integer from 3 to 5.

2. The thermosetting resin composition according to claim 1, wherein the linear 1,2-position vinyl-containing olefin resin and the modified substance thereof comprise any one or a combination of at least two of polybutadiene, a butadiene-styrene copolymer, epoxidized polybutadiene, hydroxyl-modified polybutadiene, maleic anhydride-modified polybutadiene, a maleic anhydride-modified butadiene-styrene copolymer, or olefin-modified polyphenylene ether resin.

3. The thermosetting resin composition according to claim 1, wherein the acrylic group has the following structure:

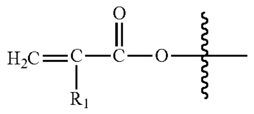

the R1 is selected from a hydrogen atom or methyl;

wherein the wavy line mark represents a linking bond.

4. The thermosetting resin composition according to claim 1, wherein the thermosetting resin composition further comprises component D: an auxiliary crosslinker substituted with vinyl or allyl, and a polymer thereof, which has the following structure:

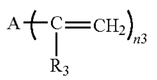

the n3 is 2 or 3;

the R3 is selected from a hydrogen atom or methyl;

the A has a structure selected from any one of the following:

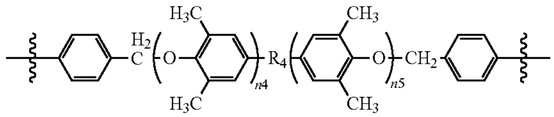
,

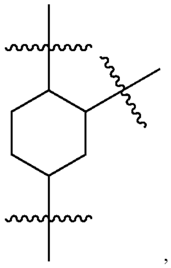
,
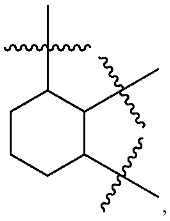
,

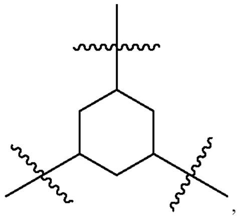
,
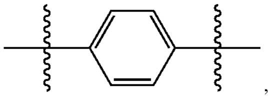
,

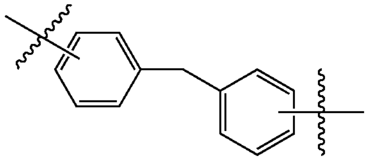
,

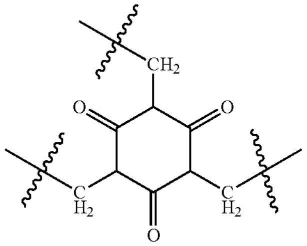
,

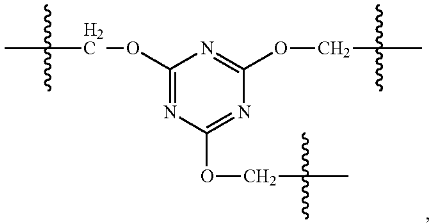
, or

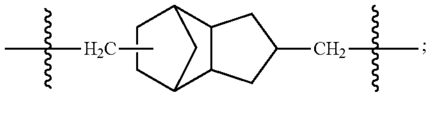
;

wherein a sum of n4 and n5 is an integer from 10 to 20;

the R4 has a structure selected from any one of the following:

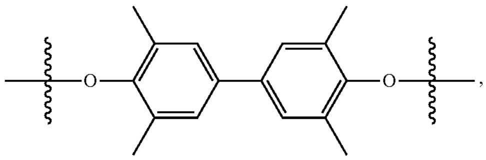
,

-continued

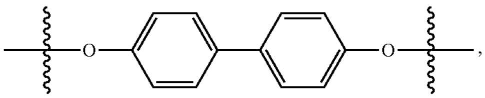
,

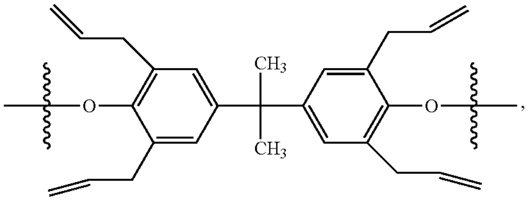
,

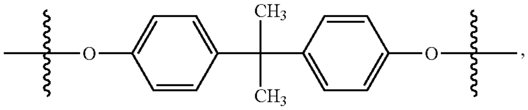
,

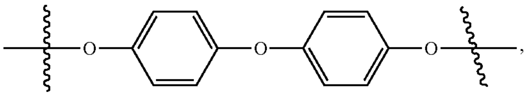
, or

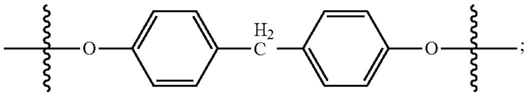
;

wherein the wavy line mark represents a linking bond.

5. A prepreg, comprising a reinforcing material, and the thermosetting resin composition according to claim 1 which is adhered to the reinforcing material after impregnating and drying.

6. A laminate, comprising at least one prepreg according to claim 5.

7. The thermosetting resin composition according to claim 1, wherein in the resin or the small-molecule compound substituted with at least one acrylic group, the resin comprises any one of

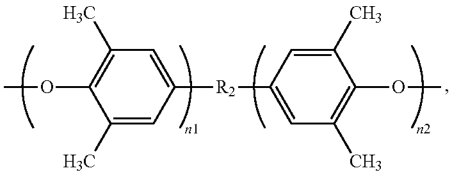
, polybutadiene or a butadiene-styrene copolymer;

wherein a sum of n1 and n2 is an integer from 10 to 20;

the R2 has a structure selected from any one of the following:

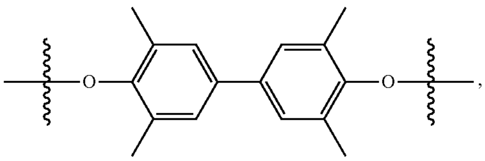
,

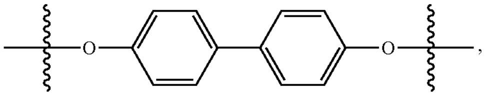
,

-continued

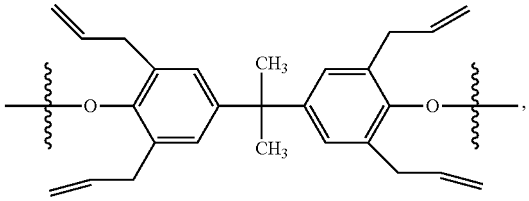
,
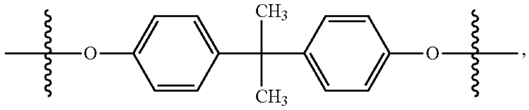
,
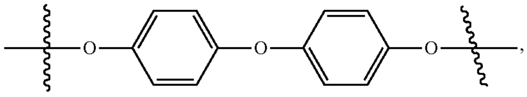
, or
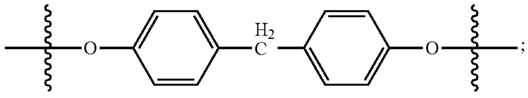
;

wherein the wavy line mark represents a linking bond.

8. The thermosetting resin composition according to claim 1, wherein in the resin or the small-molecule compound substituted with at least one acrylic group, the small-molecule compound comprises any one of

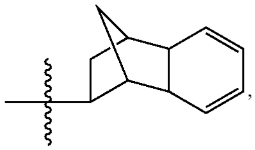 [SMILES: *C1CC2CC1C1C=CC=CC21]
,

C6-C18 linear alkane,

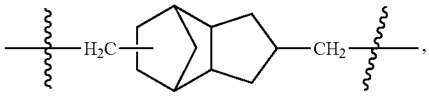
,
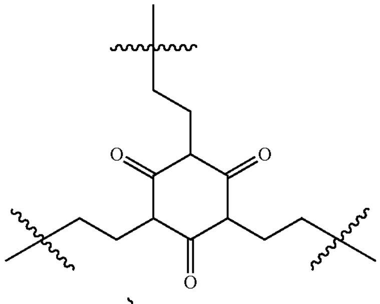
,
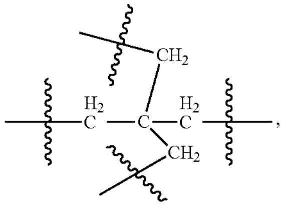
, or

-continued

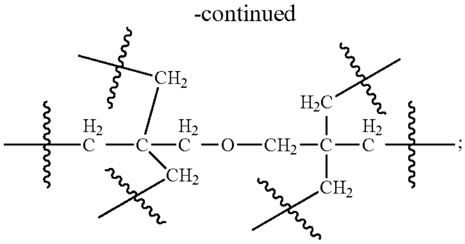
;

wherein the wavy line mark represents a substitution site of the acrylic group on the small-molecule compound.

9. The thermosetting resin composition according to claim 4, wherein based on a total mass of component A, component B, component C and component D being 100%, an addition amount of the component D is 1%-70%.

10. The thermosetting resin composition according to claim 4, wherein the thermosetting resin composition further comprises component E: an auxiliary crosslinker substituted with at least one maleimide group; based on a total mass of component A, component B, component C, optional component D and component E being 100%, an addition amount of the component E is 1%-50%.

11. The thermosetting resin composition according to claim 10, wherein the thermosetting resin composition further comprises component F: a filler; the filler comprises an inorganic filler and/or an organic filler.

12. The thermosetting resin composition according to claim 11, wherein the filler has a median particle size of 0.01-50 μm.

13. The thermosetting resin composition according to claim 11, wherein based on a total mass of component A, component B, component C, optional component D, and optional component E being 100%, an addition amount of the component F is 1%-400%.

14. The thermosetting resin composition according to claim 11, wherein the thermosetting resin composition further comprises component G: a radical initiator; the radical initiator comprises any one or a combination of at least two of organic peroxide, a carbon radical initiator or an azo radical initiator; based on a total mass of component A, component B, component C, optional component D, and optional component E being 100%, an addition amount of the component G is 0.01%-6%.

15. The thermosetting resin composition according to claim 14, wherein the thermosetting resin composition further comprises component H: a flame retardant; the flame retardant comprises a non-halogenated flame retardant and/or a halogenated flame retardant.

16. The thermosetting resin composition according to claim 15, wherein based on a total mass of component A, component B, component C, optional component D, and optional component E being 100%, an addition amount of the component His 1%-50%.

17. The thermosetting resin composition according to claim 11, wherein the thermosetting resin composition further comprises component I: a coupling agent; based on a total mass of component F being 100%, an addition amount of the component I is 0.25%-4%.

18. The thermosetting resin composition according to claim 17, wherein the coupling agent comprises any one or a combination of at least two of vinyl siloxane, methacrylic siloxane or aniline siloxane.

* * * * *